INVENTORS
JOHN T. WALLMARK &
HARWICK JOHNSON
BY J. L. Whittaker
ATTORNEY

INVENTORS
JOHN T. WALLMARK &
HARWICK JOHNSON
BY [signature]
ATTORNEY 3,038,085

SHIFT-REGISTER UTILIZING UNITARY MULTI-ELECTRODE SEMICONDUCTOR DEVICE

John T. Wallmark and Harwick Johnson, Princeton, N.J., assignors to Radio Corporation of America, a corporation of Delaware Filed Mar. 25, 1958, Ser. No. 723,882
13 Claims. (Cl. 307—88.5)

This invention relates in general to novel multi-electrode semiconductor devices and more particularly to improved devices adapted to be operated in switching circuits such as shift registers.

Switching circuits are used extensively in electronic computers, for example, and may take the form of shift registers, pulse counters, and the like. In general, the switching circuits include a plurality of interconnected components or stages, each stage including at least one active element such as a vacuum tube, gas tube, or semiconductor device. Conventional switching circuits, whether employing tubes or semiconductor devices such as transistors, are subject to the disadvantage that a plurality of tubes or transistors, as the case may be, as well as interconnecting circuits are required. Because of the large number of components required, the space and weight requirements for such circuits may be large, circuit reliability may be reduced and maintenance may be difficult. In digital computer circuits in particular, switching speed may be reduced, and if vacuum tubes are utilized, large amounts of heater power may be required.

It is, accordingly, an object of the present invention to provide improved semiconductor devices.

Another object of the present invention is to provide improved semiconductor switching devices adapted to be operated with simplified circuitry.

A further object of the present invention is to provide improved semiconductor devices and circuits for storing digital information.

Still a further object of the present invention is to provide an improved shift-register transistor which comprises a single multi-electrode semiconductor device.

Yet another object of the present invention is to provide an improved shift register transistor in which interstage coupling is provided directly with the transistor.

Another object of the present invention is to provide a novel shift-register transistor having built-in interrogation means.

The foregoing objects are accomplished in accordance with the present invention by an improved semiconductor device which comprises a plurality of bistable elements on a single crystal semiconducting body. Each element is hereinafter referred to as a section of the composite device. In accordance with one feature of the invention, an electric field applied to the body shifts minority carriers between adjacent sections to provide coupling therebetween.

In a preferred embodiment of the invention, each section of the device further includes a base region of one conductivity type crystalline semiconducting material, an emitter electrode in rectifying contact with one portion of the base region, a collector region of opposite conductivity type to that of the base region in rectifying contact with another portion of the base region and common to all sections of the device, and collector electrode means in contact with the collector region adapted to collect charge carriers which are majority carriers with respect to the base region, at low collector electrode currents and adapted to inject charge carriers which are minority carriers with respect to the base region, into the collector region at higher collector electrode currents. At opposing ends of the collector region ohmic contact electrodes are attached for providing an electric field in the collector region to shift minority charge carriers between adjacent sections of the device.

As the collector electrode current is increased in any of the sections, as by increasing the collector-to-emitter voltage, a value is reached where a transition occurs and a high current flows. This occurs because of a negative resistance characteristic inherent in each bistable section of the device. A short voltage pulse applied between emitter and collector electrodes of one section may be used to switch the section to the high conductivity mode. In addition, with a section in the high current conduction condition, short voltage pulses applied to the ohmic contacts at the ends of the collector cause a shift of minority carriers to an adjacent section. The presence of minority charge carriers causes triggering action and high current flow in the adjacent section. As one section of the device reaches the high current region, the current from the signal input source can be removed without affecting the collector electrode current.

A preferred embodiment of the improved device, additional species thereof, a method of manufacture, and improved circuits which illustrate mode of operation will now be more particularly described with the aid of the drawing, in which like parts of the various figures are designated with like numerals.

Figures 1, 2, 3A, 3B, 4A, 4B:
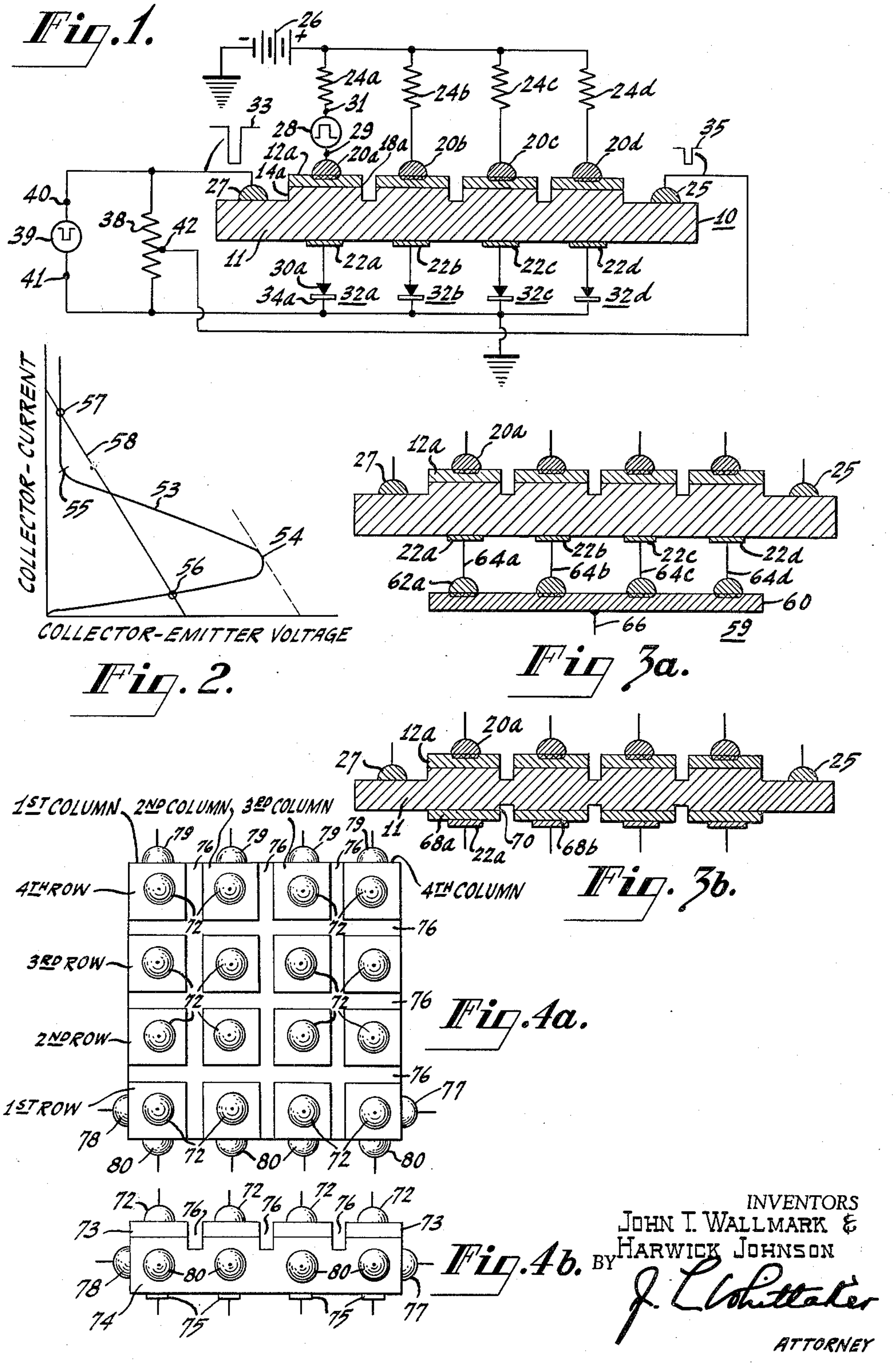
FIGURE 1 is a schematic circuit diagram of a shift-register circuit including an elevation cross-section view taken longitudinally through one embodiment of a semiconductor device in accordance with the present invention.
FIGURE 2 is a graph showing how collector-emitter current is related to collector-emitter voltage of the device shown in FIGURE 1.
Figure 5A:
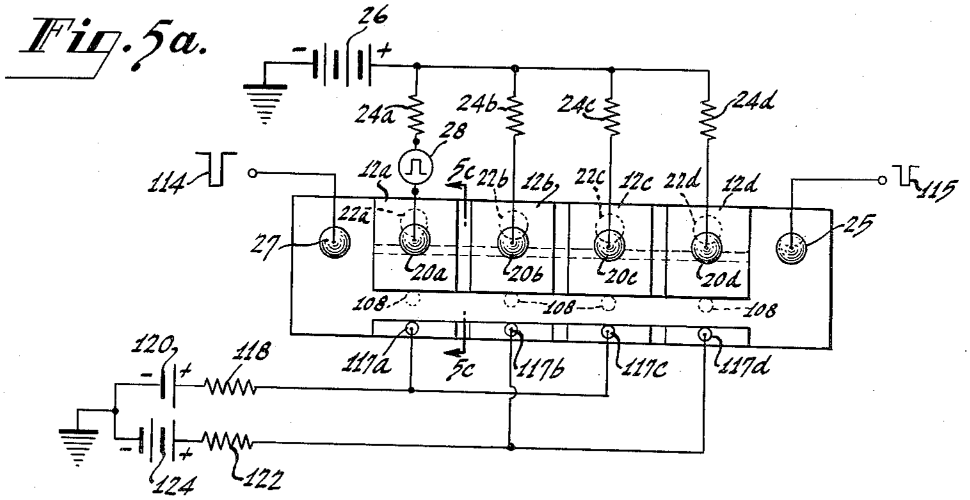
Figure 5B:
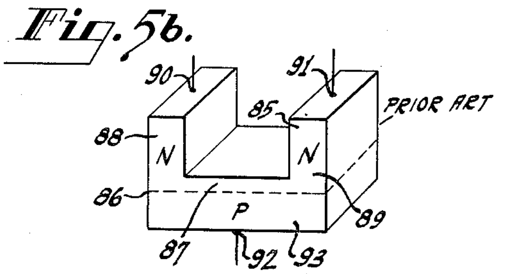
Figure 5C:
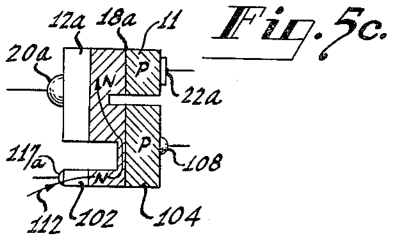
Figure 6:
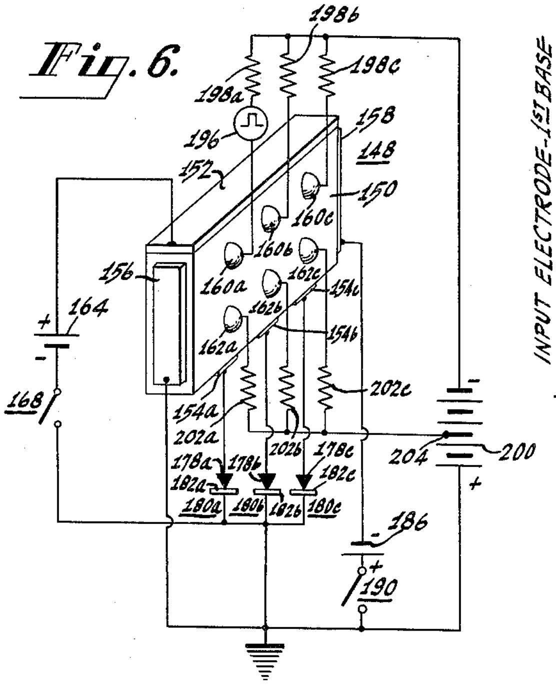
Figure 7:
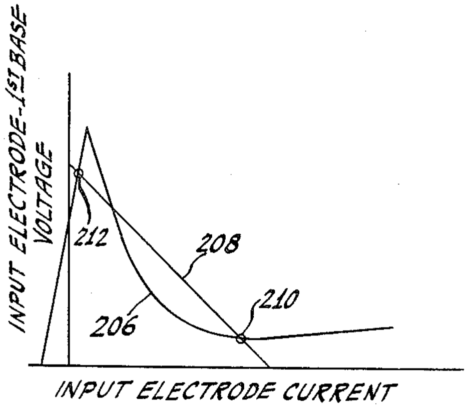

FIGURE 3*a* is an elevation cross-section view of a modification of the semiconductor device shown in FIGURE 1;

FIGURE 3*b* is an elevation cross-section view of a further modification of the device shown in FIGURE 3*a*;

FIGURE 4*a* is a plan view of another modification of the switching device shown in FIGURE 1 which includes provision for switching in two dimensions;

FIGURE 4*b* is an elevation view of the device of FIGURE 4*a*;

FIGURE 5*a* is a plan view of another modification of the device of FIGURE 1 which includes the addition of a unipolar interrogation gate integral with the semiconductor body;

FIGURE 5*b* is an isometric view of a unipolar transistor known in the prior art;

FIGURE 5*c* is a cross-sectional view of the device of FIGURE 5*a* looking in the direction indicated by the arrows 5*c*—5*c*;

FIGURE 6 is a schematic circuit diagram of another shift-register circuit embodying a feature of the invention and showing the semiconductor device in perspective view; and FIGURE 7 is a graph showing how the voltage between the input electrode and the first base electrode varies with input electrode current of the device shown in FIGURE 6.

Referring now to FIGURE 1, a preferred embodiment of a semiconductor device 10 in accordance with the present invention is shown in a shift-register circuit. The semiconductor device 10 comprises a plurality of similarly constituted transistor sections each including emitter, base and collector zones suitably assembled on a semiconductor body. Each section is further equivalent in structure to the thyristor disclosed in the application of C. W. Mueller and L. E. Barton Serial No. 677,295 filed August 9, 1957, now Patent No. 2,968,751.

The semiconductor device 10 comprises an elongated body of single crystalline semiconductive germanium 11 of one conductivity type having a plurality of plateau portions 14 each of which has a layer 12 of opposite conductivity type material disposed on the top thereof. The layers 12 may be made by diffusing arsenic into the germanium which was originally P-type.

Each of the transistor sections previously mentioned comprises a base region, a collector region, a particular type of collector connecting electrode, and an emitter region with its associated connecting electrode. The base region is separated from both the collector region and the emitter region by rectifying barriers. The base region 12 of each transistor section is the previously referred to diffused layer on the top of each plateau portion 14. Each collector region 11 is a portion of the semiconductor body and in this example is 3 ohm-cm. P-type germanium doped with indium. These collector regions are 4 mils thick. The emitter regions 20, each about 5 mils in diameter, are each made by alloying a dot of material composed of 99.6% indium and 0.4% aluminum into the base region 12.

The special collector contact electrodes 22 are disposed directly opposite to the emitter electrodes 20 and are adapted to collect holes at low values of collector electrode current and to inject electrons at collector electrode currents above this low value, thereby providing a negative resistance input characteristic. In the present preferred embodiment, these electrodes each comprises a drop of solder bonded to the collector region 11. In one embodiment the solder was composed 49% lead and 49% tin with 2% indium. The solder is composed of a minor proportion of a metal which is a P-conductivity type-determining impurity for the collector region 11 and the bulk proportion being of metals which are neither N- nor P-type impurities with respect to the collector region. It has also been found that a solder containing about 2% antimony in place of the indium can be used if it is bonded to the collector region at a low enough temperature, for example 425° C., so that the nature of the contact is predominantly that of an ohmic contact at low current densities and an electron injector at high current densities. Pure tin contacts have also been used.

Adjacent plateau sections 14 in the semiconductor device are separated by channels .024 inch side and .0005 inch in depth. The channel depth is sufficient to penetrate beyond the base region 12 and into the collector region 11, thereby insuring that the collector region provides the only common path between adjacent sections. These channels are provided along the entire length of the semiconductor material for as many sections as may be provided. Although FIGURE 1 shows a semiconductor device having four sections, any number may be used, depending upon the particular application desired.

The semiconductor body is also provided with two ohmic contact electrodes 25 and 27 bonded to opposite ends of the collector region 11. The electrodes 25 and 27 are made of the same material as the electrode regions 20.

The methods used in the manufacturing steps are briefly as follows. A wafer of P-type germanium is subjected to a diffusion treatment with the arsenic impurity in order to cause traces of the arsenic to penetrate a surface layer of about 0.1 to 0.3 mils thick over the entire surface of the wafer. This is accomplished by heating in the presence of a source of arsenic in a vacuum for two hours at 800° C. The layer into which the arsenic has diffused is then etched away except for the plurality of base regions 12*a*, 12*b*, 12*c* and 12*d* which it is desired to leave in the finished device.

The individual units are obtained by protecting the areas in which etching is not desired with Ceresine wax, and etching-off the remainder of the surface with a solution made up by adding 1 drop of a 0.55% aqueous solution of potassium iodide to 1 liter of a solution made up of 600 cc. Conc. nitric acid, 300 cc. glacial acetic acid, and 100 cc. 48% hydrofluoric acid. Etching time is about one minute or slightly longer. After removing the etching solution by rinsing, and then drying, the wax which had been protecting the base region is removed with benzene and the entire crystal is given an additional etch in the same etching solution for about 15 seconds, after which it is rinsed in distilled water. At this stage, the unit comprises the P-type collector region 11 with the plateaus 14*a*, 14*b*, 14*c* and 14*d* of the same type of germanium surmounted by the base regions 12*a*, 12*b*, 12*c* and 12*d*. The width of the plateaus are .016 inch.

The emitter electrodes 20*a*, 20*b*, 20*c* and 20*d* and the shift electrodes 25 and 27 are next attached by placing small cleaned squares of indium-aluminum alloy (0.4% aluminum) coated with a small amount of a conventional aluminum flux on a portion of the base region and at the ends of the collector region. The indium-aluminum alloy square is .003″ on a side. The unit, thus far assembled, is then heated in dry hydrogen at 450° C. for 3 minutes and cooled over a period of 20 minutes to 300° C. after which it is allowed to cool to room temperature. Any flux residue is rinsed off in hydrochloric acid and the acid is then rinsed off in distilled water and the unit is dried.

The electrodes 22*a*, 22*b*, 22*c* and 22*d* are then attached to the collector region 11 by placing a drop of solder composed of 49% lead, 49% tin, 2% indium in contact with the surface of the collector region 11 and heating in dry hydrogen to 425° C. for 2 minutes. The other solders previously described might also be used in the same manner.

Various changes can be made in the construction of the device without materially changing the operation which will be described later. For example, the emitter electrode does not necessarily have to be surface alloyed to form a recrystallized region but can be a surface barrier rectifying electrode. The base region is also not limited to the configuration illustrated and described. As described, the base region has its impurity concentration graded from the more concentrated outer surface to the less concentrated inner surface adjacent the rectifying barrier. This is a preferred form, but the device operates in substantially the same manner if the impurity concentration is uniform throughout the base or if the impurity is introduced in other ways. An NPN as well as a PNP configuration can be used.

The novel semiconductor device in FIGURE 1 is shown in a shift-register circuit as an example of a useful circuit application. Hereinafter the device 10 will be referred to as a shift-register transistor. A shift-register circuit may be used as a memory or storage element in digital computers for example. Digital computers normally employ a binary number system, and therefore devices which can assume two discrete states such as an "on" state and an "off" state may be used for various operations therein. The "off" state and the "on" state represent either a one or a zero in binary notation. The use of bistable multivibrators for this purpose is well known. Use of the shift-register transistor permits simpler interconnecting circuitry than is required with bistable multivibrators using vacuum tubes or separate transistors.

Suppose, a digital computer is required to perform an arithmetic operation, say addition, on two numbers which are stored in a main computer memory. Ordinarily, it is not possible to abstract both numbers from the main computer memory simultaneously. Since the unit which will actually perform the arithmetic may require that both numbers be applied simultaneously, it is generally required that at least one of the numbers be stored, temporarily, in a one-word memory device. Similarly, it may not be feasible to return the arithmetic unit output immediately to the main memory. In this case, again, a one-word memory or storage device is needed. Such a device may be the shift-register illustrated in FIGURE 1.

Since four sections are shown on the composite semiconductor device, it can store four binary bits of information. However, this is not intended to be a limitation, and as many sections may be provided on the device as required for any particular application.

The novel shift-register transistor which has been described may be connected into a shift-register circuit as follows. An input signal source 28 has a terminal 29 connected to the emitter 20*a* and another terminal 31 connected to one terminal of a load resistor 24*a*. The other terminal of the load resistor 24*a* is connected to the positive terminal of a source of operating potential illustrated as a battery 26. Three additional load resistors 24*b*, 24*c* and 24*d* are connected between the emitters 20*b*, 20*c* and 20*d* and the positive terminal of the battery 26.

Each of the collector electrodes 22*a*, 22*b*, 22*c*, and 22*d* are connected to an anode 30*a*, 30*b*, 30*c* and 30*d* of isolating diodes 32*a*, 32*b*, 32*c* and 32*d* and the diode cathodes 34*a*, 34*b*, 34*c* and 34*d* are each connected to ground. A voltage divider resistor 38 is connected in parallel with a source of shifting signals 39 which supplies a negative voltage shifting signal. The shifting signal source has one terminal 40 connected to the shift electrode 27 for supplying a shift pulse 33 thereto and another terminal 41 is connected to ground. A tap 42 on the resistor 38 supplies a reduced amplitude negative shift voltage 35 to the shift electrode 25.

Reference is now made to FIGURE 2 to explain the operation of the semiconductor device 10. Curve 53 shows how collector-emitter current is related to collector-emitter voltage, and illustrates the negative resistance characteristic inherent in each section of the device. At low values of emitter-collector current the device shows slightly increasing current with increasing emitter-collector voltage. As the emitter-collector current increases further, a breakover point 54 is reached at which time the device enters a negative resistance region and the emitter-collector voltage decreases for increasing current. At point 55 the section is broken down.

One important feature of this device is that after any section is switched into the high current region, it can be sustained there without further application of driving signal. This characteristic enables the device to store digital information.

With the resistor 24*a* in series with an emitter 20*a*, two stable operating conditions are possible corresponding to the points 56 and 57 at the intersection of the graph 53 and a load line 58. The slope of the load line 58 is determined by the size of the emitter resistor. Position 57 is usually referred to as the fired or "on" position, and position 56 as the open or "off" position. Change over from "off" to "on" can be accomplished in two ways. Either the emitter-to-collector voltage can be increased until the load line 58 has only one intersection with the characteristic 53, or a positive voltage can be impressed on the shifting contacts thereby effectively shrinking the characteristic 53 until only one intersection between the load line 58 and the characteristic 53 remains. Conversely, a change from the "on" position to the "off" position can be accomplished by lowering the emitter-to-collector voltage or impressing a negative voltage on the shifting electrodes 25 and 27 until only one intersection remains.

Referring to FIGURE 1, assume that initially all sections of the semiconductor device 10 in the "off" or low current conduction condition (corresponding to the point 56 of FIGURE 2) and a series of positive pulses corresponding to a digital number is applied to the emitter 20*a* by the source 28. The first positive voltage pulse drives the first section into the high current or "on" state corresponding to the point 57 of FIGURE 2. The shift pulse electrodes 25 and 27 are excited by a continuous train of pulses which are timed to occur nominally midway between each of the input pulses. Upon application of the shift signal, the pulse which had been stored in the first section of the register is transferred to the adjacent section by means of minority carrier transfer through the collector region 11. Since the collector region is P-type, the minority carriers are electrons which are present due to electron injection from the metal contact electrode 22*a* as previously described.

Shifting digits from one section to the next adjacent section occurs due to the following mechanism: The shift pulses 33 and 35 applied to the shift electrodes 27 and 25 respectively cause an electric field to be set up in the collector region 11. The amplitude of the shift pulse 33 is larger than the amplitude of the shift pulse 35, and therefore the positive direction of the electric field is towards the shift electrode 25. On application of the shift pulses 33 and 35, a section which is in the "on" or high conduction condition will be switched "off," and, provided the electrons have a sufficiently long lifetime before recombining, will be swept in the direction of the electric field to the next adjacent section. Upon termination of the shift pulse, those sections to which minority carriers have transferred switch to the "on" or high conduction condition. Therefore, application of negative shift pulses 33 and 35 of the amplitude as described provides simultaneous turn-off and shifting of the register. The shift-register is now in a position for application of the next digit and the aforesaid procedure is repeated until the number is stored in the register.

Though not intending to be limited thereby, it is theorized that after the minority carriers have transferred and the shift pulse has been removed, minority carriers diffuse into the base region, and increase the forward bias of the emitter sufficiently to cause it to inject carrier and cause a transition to the "on" state.

The diodes 32*a*, 32*b*, 32*c* and 32*d* are inserted in series with the collector electrodes to provide a high impedance path for the shift field to prevent it from being shorted to ground by the collector electrodes.

To read out the register, it is only necessary to apply four shift pulses to the electrodes 25 and 27. In response the original input pulses will appear at the output of the last section of the shift register. In the system shown, the information can only be read into the register one digit at a time. Application of the input signal in this form is known as series read in. However, it is also possible to read in the binary information in parallel, that is, apply information simultaneously to each section of the shift-register transistor. This requires application of input signals in series with each of the emitter electrodes. In digital computers combined series and parallel information systems may be used and the circuit of FIGURE 1 may be used for converting between systems.

Thus, information can be read into the shift register of FIGURE 1 in series or parallel and read out in series or in parallel. Parallel read out requires the measurement of the voltage across the emitter resistors 24*a*, 24*b*, 24*c* and 24*d* to sense whether a section is in the "off" or "on" state.

The circuit of FIGURE 1 may be further simplified by incorporating the diodes 32*a*, 32*b*, 32*c* and 32*d* into the body of the shift-register transistor. Figures 3*a* and 3*b*, show how this is achieved. A structure 59 of FIGURE 3*a* illustrates four semiconductor junction diodes made by alloying four separate bodies 62 of an P-type impurity to a common semiconducting body 60. The common body 60 will be assumed to be of N-type conductivity and operative as the cathode of the device. Four electrodes 62*a*, 62*b*, 62*c* and 62*d* alloyed to the cathode 60 form the anode electrodes. The cathode 60 has a connecting lead 66 attached thereto and connecting leads 64*a*, 64*b*, 64*c* and 64*d* are attached to the respective anode electrodes. The connecting leads 64*a*, 64*b*, 64*c* and 64*d* are connected with the respective collector electrode connectors 22*a*, 22*b*, 22*c* and 22*d* on the shift-register transistor 10. Four diodes have been shown on the device 59 to correspond with the four-section shift-register transistor 10 to which it is connected. With electrodes of the conductivity specified, the structure 59 may be substituted for the diodes 32*a*, 32*b*, 32*c* and 32*d*.

FIGURE 3*b* shows a shift-register transistor in which the isolating diodes are included integrally with the transistor. A description will be given of only one section and it will be understood that the same description applies to the other sections. The shift-register transistor as heretofore described includes the semiconductor body 11 of P-type conductivity and common to all sections. The first section further includes an emitter electrode 20*a* of P-type conductivity and an N-type base zone 12*a*. To provide the diode action an N-type region 68*a* is diffused into the collector region 11 and axially aligned on a common axis with the emitter electrode 20*a*. A rectifying barrier 70 therefore is formed between the collector region 11 and the region 68. The metallic collector electrode 22*a* is attached directly to the N-type region 68 in a manner similar to that heretofore discussed except that the solder should now contain an N-type impurity. An example of a suitable solder is 49% lead, 49% tin and 2% antimony. Separate diode sections are provided by etching a channel between each of the N-type regions 68, penetrating through the N-type region 68 into the P-type collector region 11. A PNPN type structure is thus formed having a special type of metallic collector contact.

Only one additional N-type region 68 is added to the basic shift-register transistor structure to effectively form a diode in series with the collector, since the P-type collector region 11 functions as one of diode electrodes. When a negative voltage is applied to the shift electrodes 25 and 27, the shift field will not be shorted-out by the collector because a rectifying barrier now exists between the collector region 11 and the N region 68 and presents a high impedance path to the shift field. However, electrons may still be injected from the metallic collector contact 22 into the P-type collector region 11 since the diode acts as a low impedance path for these electrons.

Please refer now to FIGURES 4*a* and 4*b* in which a modification of the shift-register transistor of FIGURE 1 is illustrated. FIGURES 4*a* and 4*b* are a plan view and a front elevation respectively of a device which provides for switching in two directions. The device consists basically of four shift-register transistors mounted back-to-back. Each section of the device includes an emitter 72, a base region 73, a collector region 74 which is common to all sections of the device, and a metallic collector electrode contact 75.

The emitter, base and collector zones alternate in conductivity type, and a rectifying barrier is formed between the emitter and base zones and the base and collector zones. Channels 76 are provided by etching for example, and extend beyond the base region 73 into the collector region 74. A plurality of switching sections are thus formed having the common collector region 74. A pair of ohmic contact electrodes 77 and 78 are attached to the collector region 74 in line with the first row of the device to provide minority carrier transfer between columns the mechanism heretofore described. Additional shift electrodes 79 and 80 are connected in ohmic contact to the collector region 74 and are located in line with the four columns of the switching sections. By applying shift pulses to the electrodes 77 and 78, any of the sections in the first row corresponding to any of the four columns may be switched. Then, by applying shift pulses to the pair of electrodes 79 and 80 for the proper column, the various column positions may be switched.

Therefore, the device shown in FIGURE 4 is a two dimensional switching device in which the "on" position can be moved to any position in the first row by applying a field between the contacts 77 and 78 and by applying a field between the contacts 79 and 80 for one of the columns, the "on" position can be moved to one of the column positions. The device therefore makes a two dimensional selector.

Although four rows and four columns have been illustrated, it is to be understood that as many rows and columns may be provided as required for a particular application.

Please refer now to FIGURES 5*a*, *b* and *c*. A modification of the basic shift-register transistor has provided means for indicating if a desired signal has been stored in the shift-register transistor. The device of FIGURE 5*a* utilizes the basic shift-register transistor structure with the addition of a unipolar transistor integral with the semiconductor body. The unipolar transistor functions as a relay which on a given signal applies an interrogating signal to the shift-register transistor. FIGURE 5*b* illustrates the basic structure of one type of unipolar transistor. In consists of a block of semiconducting material such as germanium which is partly N-type and partly P-type so that it has a PN junction indicated at the line 86. In addition, a substantially rectangular channel is etched in the N-type region providing a U-shaped structure having a web 87 connecting the arms 88 and 89 formed in the N region. A pair of ohmic contact electrodes 90 and 91, called source and drain electrodes respectively, are connected to the arms 88 and 89. An ohmic electrode 92 is connected to the P-type region 93 and is called the gate electrode.

The unipolar transistor is so called because the "working current" carried by the device is by one type of current carrier, either holes or electrons. A detailed description of such a device may be found in the article, A Unipolar "Field Effect" Transistor, by W. Shockley, Proceedings of the Institute of Radio Engineers, November 1952, pages 1365–1376. The working current flows between the ohmic contacts 90 and 91 constituting the source and drain electrodes respectively. For the N-type semiconductor illustrated, the majority carriers are electrons, supplied at the source and traveling to the drain.

In operation, the gate electrode 92 is connected to a source of negative voltage and is thereby reverse biased. A depletion layer formed at the boundary 86 extends into the web portion 87 beneath the channel. If the reverse bias voltage on the gate is high enough, the depletion region at the PN junction 86 becomes thick enough to "pinch-off" the current path through the web portion 87 through which the working current flows. If the gate bias voltage is reduced, the current path will open and current may flow between the source and the drain. The unipolar transistor therefore functions as a relay in which the current path between the source and the drain is controlled by the voltage applied to the gate electrode 86. Although the device may be turned "on" and "off" it is not bistable per se. That is, the current path will be either conducting or non-conducting only as long as the voltage is applied to the gate electrode 92.

A structure integrating the unipolar transistor with the shift register transistor is shown in FIGURES 5*a* and 5*c*. FIGURE 5*a* is a plan view of the composite device and FIGURE 5*c* is a sectional view seen looking in the direction indicated by the arrows 5*c*—5*c* of FIGURE 5*a*. In FIGURE 5*c* the shift-register transistor portion includes in the cross-section view shown an emitter electrode 20*a* of P-type conductivity, a base region 12*a* of N-type conductivity, a P-type collector region 11, and a metal electrode contact 22*a* soldered to the collector region 11.

The unipolar interrogation relay comprises an N-type conductivity zone 102 which is in common with the base zone 12*a* of the shift-register transistor. The P-type zone 104 of the interrogation relay is separated from the shift-register transistor by a channel etched into the composite structure and extending through the P-type and substantially into the N-type conductivity material.

An electrode 108 connected to the P region 104 of the interrogation relay functions as the gate electrode which opens and closes the relay. Another electrode 117 connected to the N region 102 of the interrogation relay supplies majority charge carriers or input signals to the relay. In the composite device, a drain electrode is not provided. The majority charge carriers flow from the source electrode 117 through the constricted current path and into the shift-register transistor as indicated by the arrow 112.

The emitter, collector and shift electrodes for the circuit of FIGURE 5*a* are connected in circuit in the same manner as shown for the circuit of FIGURE 1.

To illustrate the operation of this device, refer to FIGURE 5*a* and assume that the circuit is to respond specially to the binary number 0101. Accordingly, the source electrodes **117*a* and 117*c* are both connected through a resistor 118 to the positive terminal of a battery 120. The negative terminal of the battery is connected to ground. The source electrodes 117*b* and 117*d* are both connected through a resistor 122 to the positive terminal of a battery 124. The negative terminal of the battery is connected to ground. The electrodes 117*a* and 117*c* are the source electrodes for the sections which are to have a binary zero stored therein, and the 117*b* and 117*d* are the source electrodes for the sections which are to have a binary one stored therein. The terminal voltage of the battery 120 is adjusted to be equal to that of the collector-emitter voltage drop across a section of the shift-register transistor when in the "off" or non-conducting condition. In a similar manner, the terminal voltage of the battery 124** is adjusted to be equal to that of the emitter-collector voltage drop across a section of the shift-register transistor when in the "on" or conducting condition. The gate electrodes are connected to a source of negative voltage.

Assume now that the number 0101 is read into the register. Read in is accomplished in the same manner as heretofore described for the register of FIGURE 1 and the negative voltage pulses 114 and 115 are the shift pulses. When the number has been read in, a positive pulse is applied to each of the gate electrodes of the interrogation relay opening the conduction channel and effectively connecting the source electrodes **117*a*, 117*b*, 117*c* and 117*d* to the emitter electrodes 20*a*, 20*b*, 20*c* and 20*d*. With the correct number in the register, there will be no potential difference between the emitters and the source electrodes, and no current will flow through the resistors 118 or 122. If however, any other number is stored in the register, the application of the positive pulse to the interrogation relay will cause a current flow in either or both of the resistors 118 and 122**. By sensing the voltage drop across these resistors, it can be ascertained whether or not the desired number has been read in to the register.

Another embodiment of the invention comprising another improved semiconductor shift-register device and associated circuit, operating on the principle of coupling by minority carrier transfer is shown in FIGURE 6, which is now referred to. The device 148 may be looked upon as a horizontal array of double-based diodes. The device comprises a body 150 of semiconductor material such as germanium or silicon for example, and will be assumed for purpose of explanation to be of N-type conductivity. The body may be of elongated rectangular shape. One side of the semiconductor body 150 in the thickness dimension is provided with a single ohmic contact electrode 152 along substantially the entire length thereof. This may be termed the first base electrode. The opposite side of the body is provided with a plurality of ohmic electrodes **154*a*, 154*b* and 154*c* termed the second base electrodes. The other two sides of the body 150 in the thickness dimensions are provided with a pair of electrodes 156 and 158** which are also in ohmic contact with the body and may be referred to as the first and second horizontal shift electrodes respectively.

Three rectifying junction electrodes **160*a*, 160*b*, and 160*c*, hereinafter called the input electrodes, are arranged in a row on a face of the semiconductor body 150. Three additional rectifying junction electrodes 162*a*, 162*b* and 162*c***, hereinafter referred to as the active electrodes, are arranged directly alongside the input electrodes. Three sets of input, active and second base electrodes are shown, but any number may be chosen depending upon the application for the device. The input and active electrodes are assumed, for purposes of explanation, to be of P-type conductivity.

Operating bias potential is supplied to the base electrodes 152 and **154*a*, 154*b* and 154*c* by connecting the positive terminal of a battery 164 to the first base electrode 152 and the negative terminal is connected through a switch 168 to the cathodes 182*a*, 182*b* and 182*c* of isolating diodes 180*a*, 180*b* and 180*c*. Anode electrodes 178*a*, 178*b* and 178*c* are then connected to the respective base electrodes 154*a*, 154*b* and 154*c*. Closing the switch 168 applies a voltage between the base electrodes and sets up a first field in the semiconductor body between the first and second base electrodes. A second shift field at right angles to the first field is provided by connecting the negative terminal of a battery 186 to the second horizontal shift electrode 158 and the positive terminal is connected through a switch 190 to the first horizontal shift electrode 156 and to the cathodes 182*a*, 182*b*, 182*c* of isolating diodes 180*a*, 182*a*, 184*a*. Closing the switch 190 sets up the second electric field. The diodes 180*a*, 180*b* and 180*c*** prevent the second electric field from shorting to the second base electrodes.

The first input electrode **160*a* is connected in series with a source of input signals 196 and a load resistor 198*a* to the negative terminal of another operating potential source illustrated as a battery 200. The remaining input electrodes 160*b* and 160*c* are connected in series with their respective load resistors 198*b* and 198*c* to the negative terminal of the battery 200. The input electrodes are thus reverse-biased with respect to the semi-conductor body 150. The active electrodes 162*a*, 162*b* and 162*c* are connected in series with load resistors 202*a*, 202*b* and 202*c* to a negative tap 204 on the battery 200, and are also reverse-biased with respect to the semiconductor body 150**.

Before explaining the circuit operation, please refer to FIGURE 7. Curve 206 shows how the voltage between the input electrode and the first base electrode varies with input current and illustrates the negative resistance region characteristic of double base diodes which are a part of the device having the geometry shown in FIGURE 1. The slope of the load line 208 is determined by the size of the load resistors **198*a*, 198*b* and 198*c*. Because of this negative resistance characteristic, the device can occupy either of two stable states, illustrated at 210 and 212, in which the point 212 corresponds to the "off" state and the point 210** corresponds to the "on" state.

The input and active electrodes are reverse-biased and each section is therefore in the "off" condition. Switch 168 is now closed. Application of a positive pulse by the signal source 196 to the input electrode **160*a* forward biases the input electrode and switches it to the "on" state. The active electrodes, are biased less heavily in the reverse direction, and on the verge of injection. A pulse of charge carriers, in this case holes, injected by the input electrode 160*a* are swept down by the electric field set up in the device by the battery 164. The charge carriers increase the conductivity of the semiconductor material in the proximity of the active electrode 162*a* causing it to become forward-biased, thereby switching it to the "on" state. By sensing the voltage drop across the resistors 198*a* or 202*a***, the change in state may be directly measured. It is to be noted that the active electrode circuit switches state when the input electrode circuit switches state. The active electrodes may be omitted and the same type of switching operating achieved, however they serve as an additional load circuit for the device.

On termination of the input pulsee, the switch 168 is opened to remove the first or vertical drift field, and the switch 190 is closed. Closing switch 190 provides a horizontal drift field within the body 150, and reverse biases the diodes 180*a*, 180*b* and 180*c* to prevent the horizontal drift field from being shorted-out by the base electrodes 154*a*, 154*b* and 154*c*.

The horizontal drift field causes minority carriers or holes to flow towards the horizontal shift electrode 158. The spacing of the adjacent electrodes must be proper to allow the minority carriers to be transferred thereto before recombination occurs. The minority carrier lifetime depends upon the semiconductor materials used in the device. After a period of time corresponding to the transit time of the minority carriers to move laterally the spacing between sections, the switches 190 and 194 are opened to remove the horizontal drift field and the diode reverse bias voltage, and switch 168 is closed to provide the vertical drift field. Then, the section to which the carriers have transferred will switch to the "on" state. Another input pulse can then be applied to the device 148 and the aforesaid procedure repeated until all positions in the device have been filled. The active electrodes could also be used for applying input signals to the device. In addition, shifting may progress to the right or to the left, and may be advanced more than one position by allowing a longer horizontal transit time before the vertical drift field is reapplied. This device may also be used in the various applications previously described for the device of FIGURE 1.

What is claimed is:

1. A semiconductor device comprising a common collector region of one conductivity type semiconducting material, a plurality of base regions of opposite conductivity type to said collector region in rectifying contact with said collector region and arranged in spaced relation in a row along the length of said collector region, a plurality of emitter electrodes in rectifying contact with said plurality of base regions, a plurality of bistable electrode means in contact with said collector region with one of said electrode means opposite one of each of said base regions, said electrode means being responsive to predetermined low collector currents to collect charge carriers which are minority carriers with respect to said base region, and responsive to collector currents higher than said low currents to inject charge carriers which are majority charge carriers with respect to said base region, into said collector region, and means for producing an electric field along the length in said collector region for directing the flow of minority charge carriers through said collector region.

2. A semiconductor device comprising a collector region of P-type conductivity semiconducting material, a plurality of base regions of N-type conductivity in rectifying contact with said collector region and arranged in spaced relation in a row along said collector region, a plurality of emitter electrodes of P-type conductivity in rectifying contact with each of said base regions, a plurality of metallic bistable electrode, means in contact with said collector region with one of said electrode means opposite one of each of said base regions, said metallic electrode means adapted to collect holes at predetermined low collector currents, and adapted to inject electrons into said collector region at collector currents higher than said predetermined low values, and pulse means for producing an electric field along the length in said collector region to direct the flow of said electrons.

3. A semiconductor device comprising a collector region of one conductivity type semiconducting material, a plurality of base regions of opposite conductivity type to said collector region in rectifying contact with said collector region and arranged in spaced relation longitudinally along said collector region, an emitter electrode in rectifying contact with each of said base regions, a base electrode ohmically connected to at least one of said base regions in close proximity to said emitter electrode, a plurality of bistable electrode means in contact with said collector region with one of said electrode means opposite one of each of said base regions, said electrode means being responsive to predetermined low collector currents to collect charge carriers which are minority carriers with respect to said base region, and responsive to collector currents higher than said low currents to inject charge carriers which are majority charge carriers with respect to said base region, into said collector region, and pulse means for producing an electric field along the length in said collector region for directing the flow of minority charge carriers through said collector region.

4. A semiconductor device comprising a block of semiconductor material of one conductivity type, a layer of opposite conductivity type on one surface of said block whereby a rectifying barrier is disposed within said surface and adjacent to the main body of said block, a plurality of channels formed in said layer and extending through said layer of opposite conductivity material and said rectifying barrier to form a plurality of rectifying junctions in a single line longitudinally on said block, a plurality of rectifying electrodes of said one conductivity type alloyed to said layer, a plurality of bistable electrode means in contact with said block of semiconductor material with one of said electrode means opposite one of each of said rectifying junctions, said electrode means being responsive to predetermined low current through said electrode means to collect charge carriers which are minority carriers with respect to said layer, and responsive to current through said electrode means higher than said low currents to inject charge carriers which are majority charge carriers with respect to said layer, into said block of semiconductor material, and pulse means for producing an electric field longitudinally in said collector region for directing the flow of minority charge carriers through said semiconductor block.

5. A semiconductor device comprising a block of semiconductor material of N-type, a layer of P-conductivity type material diffused into one surface of said block whereby a rectifying barrier is formed within said surface and adjacent to the main body of said block in the order named, a plurality of channels formed in said diffused layer and extending through said layer of N-type conductivity material and said rectifying barrier to form a plurality of rectifying junctions in a single line longitudinally on said block, a plurality of rectifying electrodes of N-type conductivity alloyed to said diffused layer, a plurality of bistable electrode means in contact with said block of semiconductor material with one of said electrode means opposite one of each of said rectifying junctions, said electrode means being responsive to predetermined low current through said electrode means to collect holes and responsive to current through said electrode means higher than said low currents to inject electrons into said block of semiconductor material, and pulse means for producing an electric field longitudinally in said collector region for directing the flow of said electrons through said semiconductor block.

6. A semiconductor device comprising a collector region of P-type conductivity semiconducting material, a plurality of base regions of N-type conductivity in rectifying contact with one surface of said collector region and arranged in a row in spaced relation along the length of said collector region, an emitter electrode of P-type conductivity in rectifying contact with each of said base regions, a plurality of N-type conductivity regions making rectifying contact with an opposite surface of said collector material, a plurality of bistable electrode means in contact with said last named N-type region, said electrode means being responsive to predetermined low collector currents to collect holes and responsive to collector currents higher than said low currents to inject electrons into said collector region, and means for producing an electric field along the length in said collector region for directing the flow of said electrons through said collector region.

7. A semiconductor device comprising a block of semiconductor material of one conductivity type, said block comprising the collector region of said device, a base layer of opposite conductivity type on one surface of said block whereby a rectifying barrier is disposed within said surface and adjacent to the main body of said block, a plurality of channels formed in said base layer and extending through said layer of opposite conductivity material and said rectifying barrier to form a plurality of base regions in a single line longitudinally on said block, a plurality of rectifying emitter electrodes of said one conductivity type alloyed to said base layer, a plurality of metallic bistable electrodes in contact with said collector region and aligned on a common axis with said base regions and said emitter electrodes, said metallic electrodes being responsive to predetermined low current through said electrode means to collect charge carriers which are minority carriers with respect to said base layer, and responsive to current through said electrode means higher than said low currents to inject charge carriers which are majority charge carriers with respect to said base layer, into said block of semiconductor material, and a pair of ohmic contact electrodes for applying an electric field to said collector region for directing the flow of minority charge carriers through said collector region.

8. A semiconductor device comprising a block of semiconductor material of one conductivity type, said block comprising the collector region of said device, a layer of a substance diffused into one surface of said block whereby a rectifying barrier and a layer of base material of opposite conductivity type are formed within said surface and adjacent to the main body of said block in the order named, a plurality of channels formed in said diffused base layer and extending through said layer of opposite conductivity material and said rectifying barrier to form a plurality of base regions in a single line longitudinally on said block, a plurality of rectifying emitter electrodes of said one conductivity type alloyed to said diffused base layer, a plurality of collector electrodes in contact with said collector region, each combination of an emitter, a base, and a collector electrode defining a bistable unit, and means for producing an electric field longitudinally in said collector region for directing the flow of charge carriers through said collector region.

9. A semiconductor device comprising a semiconductive body having opposite faces, a plurality of ohmic contact base electrodes in contact with said body at two of said opposite faces, a pair of ohmic contact shift electrodes in contact with said body at another two of said opposite faces, a plurality of rectifying electrodes arranged in spaced relation along the length of said body, and pulse means for selectively applying a biasing potential between said base electrodes to provide coupling between said rectifying electrodes.

10. In a shift-register circuit, the combination comprising, a semiconductor device including a body of semiconductive material of one conductivity type, said body being the collector region of said device, a plurality of base regions of opposite conductivity type to said collector region in rectifying contact with said collector region, said base regions arranged in a row along the length of said collector region, a plurality of emitter electrodes in rectifying contact with said base regions, a plurality of collector electrodes in contact with said collector region and aligned on a common axis with said emitter and said base electrodes, a pair of shift electrodes in ohmic contact with and aligned along the length of said collector region, each combination of an emitter, a base, and a collector electrode defining a bistable circuit, means for biasing said emitter electrodes to a low current conduction condition, means for applying voltage pulses to said emitter electrodes to switch said emitter electrodes to a high current conduction condition, and means for applying voltage pulses to said shift electrodes for transferring said high conduction condition to adjacent emitter electrodes, and output circuit means coupled with each of said collector electrodes.

11. A semiconductor device comprising a block of semiconductor material of one conductivity type, a layer of opposite conductivity type on two opposite surfaces of said block whereby rectifying barriers are disposed within each of said surfaces and adjacent to the main body of said block, a plurality of channels formed in said layers, and extending through said layer of opposite conductivity material and said rectifying barrier to form a plurality of rectifying junctions in a single line longitudinally on said block, a plurality of rectifying electrodes of said one conductivity type alloyed to said layer on one of said surfaces, a plurality of bistable electrode means in contact with said layer on the opposite of said surfaces with one of said electrode means opposite one of each of said rectifying junctions, said electrode means being responsive to predetermined low current through said electrode means to collect charge carriers which are minority carriers with respect to said layer, and responsive to current through said electrode means higher than said low currents to inject charge carriers which are majority charge carriers with respect to said layer, into said block of semiconductor material, and pulse means for producing an electric field longitudinally in said collector region for directing the flow of minority charge carriers through said semiconductor block.

12. In a shift-register circuit, the combination comprising a semiconductor device including a collector region of one conductivity type semiconducting material, a plurality of base regions of opposite conductivity type to said collector region in rectifying contact with said collector region and arranged in spaced relation in a row along said collector region, an emitter electrode in rectifying contact with each of said base regions, a plurality of bistable electrode means in contact with said collector region, said electrode means being responsive to predetermined low collector currents to collect charge carriers which are minority carriers with respect to said base region, and responsive to collector currents higher than said low currents to inject charge carriers which are majority charge carriers with respect to said base region, into said collector region, a plurality of ohmic contact electrodes connected to opposing ends of said collector region, unilateral impedance means in series with each of said electrode means, output circuit means coupled to each of said emitter electrodes, means for applying biasing potential to said emitter electrodes, means for applying voltage pulses to said emitter electrodes, and means for applying voltage pulses to said ohmic contact electrodes.

13. A semiconductor device comprising a body of single crystalline semiconducting material, a plurality of bistable rectifying elements in a row each having a portion thereof an integral part of said body and each also including means for injecting relatively heavy currents of minority charge carriers into said portion, means for applying an electric field between opposite ends of said body across said portions to direct said minority charge carriers within said body from one to another of said portions, said portions being spaced a distance which allows charge carriers to flow therebetween before recombining with majority charge carriers, and pulse means connected integrally with said body to determine the presence of said current of minority charge carriers in said body opposite each of said rectifying means.

References Cited in the file of this patent

UNITED STATES PATENTS

| | | |
|---|---|---|
| 2,586,080 | Pfann | Feb. 19, 1952 |
| 2,655,625 | Burdton | Oct. 13, 1953 |
| 2,689,930 | Hall | Sept. 21, 1954 |
| 2,736,822 | Dunlap | Feb. 28, 1956 |
| 2,761,020 | Shockley | Aug. 28, 1956 |
| 2,770,740 | Reeves | Nov. 13, 1956 |
| 2,801,348 | Pankove | July 30, 1957 |
| 2,820,154 | Kurshan | Jan. 14, 1958 |
| 2,832,898 | Camp | Apr. 29, 1958 |
| 2,856,544 | Ross | Oct. 14, 1958 |
| 2,877,358 | Ross | Mar. 10, 1959 |
| 2,922,898 | Henisch | Jan. 26, 1960 |
| 2,953,693 | Philips | Sept. 20, 1960 |
| 2,967,952 | Shockley | Jan. 10, 1961 |